US007106059B2

(12) United States Patent
Takasugi et al.

(10) Patent No.: US 7,106,059 B2
(45) Date of Patent: Sep. 12, 2006

(54) METHOD OF QUANTIFYING MAGNETIC RESONANCE SPECTRUM

(75) Inventors: Kenji Takasugi, Saitama (JP); Tomomitsu Kurimoto, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 11/107,356

(22) Filed: Apr. 15, 2005

(65) Prior Publication Data

US 2005/0237058 A1 Oct. 27, 2005

(30) Foreign Application Priority Data

Apr. 15, 2004 (JP) ............................ 2004-119750
Feb. 23, 2005 (JP) .............................. 2005-46419

(51) Int. Cl.
*G01V 3/00* (2006.01)

(52) U.S. Cl. ...................................... 324/307; 324/309

(58) Field of Classification Search ................ 324/307, 324/309, 318, 319, 322, 300, 312, 314; 600/410
See application file for complete search history.

(56) References Cited

U.S. PATENT DOCUMENTS 4,684,890 A * 8/1987 Briguet et al. .............. 324/309
4,691,162 A * 9/1987 Van Uijen .................. 324/309
4,763,282 A * 8/1988 Rosenberg .................. 600/310
5,262,723 A * 11/1993 Hurd et al. ................. 324/309
5,274,329 A * 12/1993 Knuttel et al. ............. 324/307
5,572,125 A * 11/1996 Dunkel ....................... 324/307
6,472,870 B1 * 10/2002 Bendall et al. ............. 324/307
6,831,459 B1 * 12/2004 Szyperski et al. .......... 324/309

FOREIGN PATENT DOCUMENTS

| | | |
|---|---|---|
| JP | 56-014146 | 2/1981 |
| JP | 59-136642 | 8/1984 |
| JP | 63-142249 | 6/1988 |
| JP | 2004-32540 | 11/2004 |

* cited by examiner

*Primary Examiner*—Brij B. Shrivastav
(74) *Attorney, Agent, or Firm*—The Webb Law Firm

(57) ABSTRACT

A method is offered which is capable of quantifying all the peaks of a magnetic resonance spectrum based on a theoretical relationship between the real and imaginary parts of the spectrum without phase correcting the peaks. First, the spectra of the real and imaginary parts are found by quadrature detection. Then, integrated values a and b over given regions of the obtained spectra of the real and imaginary parts, respectively, are found. An integral intensity of a spectral peak in the spectrum is calculated to be $\pm\sqrt{(a^2+b^2)}$.

8 Claims, 11 Drawing Sheets

METHOD OF QUANTIFYING MAGNETIC RESONANCE SPECTRUM

BACKGROUND OF THE INVENTION

1. Field of the Invention

The present invention relates to a method of quantifying magnetic resonance spectra used in magnetic resonance instruments.

2. Description of Related Art

Generally, in a Fourier-transform magnetic resonance method, such as Fourier-transform NMR (FT-NMR) spectroscopy or Fourier-transform electron spin resonance (FT-ESR) spectroscopy, real and imaginary parts are mixed in the observed spectrum. Therefore, it is necessary that phase correction be made after the observation of the spectrum and that the spectrum be separated into a spectrum consisting only of the real part and a spectrum consisting only of the imaginary part.

Heretofore, such a magnetic resonance spectrum has been quantified by the following method. The spectrum is appropriately phase corrected using a manual or automated phase correction method. Then, a desired portion of the real part of the spectrum is extracted. The integrated value of the real part in this range is found.

In this case, execution of phase correction is essential prior to the integration. However, it is very difficult to automatically correct the phase of a spectrum containing plural peaks of various heights. Hence, manual phase correction has been indispensable. See Japanese Patent Laid-Open No. S56-14146; Japanese Patent Laid-Open No. S59-136642; Japanese Patent Laid-Open No. S63-142249; and Japanese Patent Laid-Open No. 2004-325407.

In the prior art method, manual phase correction is inevitably performed during the procedure of quantification analysis. Therefore, there is the problem that if the other portions of the analytical processing are automated, complete automation cannot be achieved.

SUMMARY OF THE INVENTION

In view of the foregoing, it is an object of the present invention to provide a method of quantifying a magnetic resonance spectrum in such a way that all the peaks can be quantified without phase correcting the peaks, based on a theoretical relation between the real and imaginary parts of the magnetic resonance spectrum.

A method of quantifying a magnetic resonance spectrum in accordance with a first aspect of the present invention for achieving the above-described object is used to find an integral intensity of a spectral peak in the spectrum. In this method, (1) spectra of the real and imaginary parts are found by quadrature detection. (2) Integrated values, a and b, of the obtained spectra of the real and imaginary parts over desired regions are found. (3) The integral intensity is found by calculating $\pm\sqrt{(a^2+b^2)}$.

A method according to a second aspect is characterized in that an optimum pulse width obtained during measurement of a magnetic resonance spectrum is automatically determined using the integral intensity of a magnetic resonance peak (magnetization) obtained by the quantification method according to the first aspect.

A method of finding an integral intensity of a spectral peak in a magnetic resonance spectrum in accordance with a third aspect of the present invention comprises the following steps. (1) N one-dimensional (1D) magnetic resonance spectra, each consisting of real and imaginary parts, are observed and collected by quadrature detection. (2) Integrated values of the real and imaginary parts, respectively, over given ranges of frequencies of each of the obtained n 1D magnetic resonance spectra are found. (3) The integrated value $x_i$ of the real part and the integrated value $y_i$ of the imaginary part (i=1, 2, . . . , n) obtained in step (2) are fitted to a straight line y=a x+b (where b is an offset value) on a complex plane by a linear regression technique. (4) Actually measured data points $(x_i, y_i)$ are projected onto the fitting line y=a x+b. The projected points are taken as new points $(x_i, y_i)$. (5) The value of the distance $(\sqrt{/(x_i-x_0)^2+(y_i-y_0)^2})$ from a projected data point $(x_0, y_0)$ under conditions where zero peak intensity is produced to each projected data point $(x_i, y_i)$ is found. This value is taken as the integral intensity of the spectral peak (magnetization).

A method in accordance with a fourth aspect of the present invention is used to find an integral intensity of a spectral peak in a magnetic resonance spectrum. This method comprises the following steps. (1) N one-dimensional (1D) magnetic resonance spectra, each consisting of real and imaginary parts, are observed and collected by quadrature detection. (2) Integrated values of the real and imaginary parts, respectively, over given ranges of frequencies of each of the obtained n 1D magnetic resonance spectra are found. (3) The integrated value $x_i$ of the real part and the integrated value $y_i$ of the imaginary part (i=1, 2, . . . , n) obtained in step (2) are fitted to a straight line y=a x+b (where b is an offset value) on a complex plane by a linear regression technique. (4) Actually measured data points $(x_i, y_i)$ are projected onto the fitting line y=a x+b. The projected points are taken as new points $(x_i, y_i)$. (5) The value of the distance $(\sqrt{(x_i-x_0)^2+(y_i-y_0)^2})$ from a projected data point $(x_0, y_0)$ under conditions where zero peak intensity is produced to each projected data point $(x_i, y_i)$ is found. This value is taken as the absolute value of the integral intensity of the spectral peak (magnetization). (6) Reference data items are taken as the coordinate values $(x_1, y_1)$ of the first point. The sign $(sign_i)$ of $(x_i-x_0)/(x_1-x_0)$ is found for the ith data item $(x_i, y_i)$. This sign is taken as the sign of the spectral peak (magnetization). (7) Based on the absolute value obtained in step (5) and the sign obtained in step (6), the value of $sign_i \times \sqrt{(x_i-x_0)^2+(y_i-y_0)^2}$ is found. This value is taken as the integral intensity of the spectral peak (magnetization).

In a method according to a fifth aspect of the present invention, an optimum pulse width during measurement of a magnetic resonance spectrum is automatically determined using an integral intensity of a spectral peak (magnetization) obtained by the quantification method according to the fourth aspect.

A method in accordance with a sixth aspect of the present invention is used to find an integral intensity of a spectral peak in a magnetic resonance spectrum. This method comprises the following steps. (1) N one-dimensional (1D) magnetic resonance spectra, each consisting of real and imaginary parts, are observed and collected by quadrature detection. (2) Integrated values of the real and imaginary parts, respectively, over given ranges of frequencies of each of the obtained n 1D magnetic resonance spectra are found. (3) The integrated value $x_i$ of the real part and the integrated value $y_i$ of the imaginary part (i=1, 2, . . . , n) obtained in step (2) are fitted to a straight line y=a x+b (where b is an offset value) on a complex plane by a linear regression technique. (4) Actually measured data points $(x_i, y_i)$ are projected onto the fitting line y=a x+b. The projected points are taken as new points ($x_i$, $y_i$). Reference data items are taken as the coordinate values ($x_i$, $y_i$) of the first point. The sign ($sign_i$) of ($x_i-x_1$) is found for the ith data item ($x_i$, $y_i$). This sign is taken as the sign of the spectral peak (magnetization). (6) Based on the sign ($sign_i$) obtained in step (5), the value of $sign_i \times \sqrt{(x_i-x_0)^2+(y_i-y_0)^2}$ is found. The value is handed over to a least squares fitting program for calculating a pulse width. (7) Based on the least squares fitting program for calculation of a pulse width, the dependence of the magnitude of the spectral peak (magnetization) on the pulse width is curve-fitted to a given model function. A pulse width optimal for observation of a spectrum is determined from parameters of the model function to which the curve-fitting has been done.

In one feature of the present invention, the magnetic resonance spectrum described above is an NMR spectrum.

In another feature of the present invention, the magnetic resonance spectrum described above is an ESR spectrum.

The method of quantifying a magnetic resonance spectrum in accordance with the present invention is intended to find an integral intensity of a spectral peak in the spectrum. The method comprises the following steps. (1) Spectra of the real and imaginary parts are found by quadrature detection. (2) Integrated values, a and b, of the obtained spectra of the real and imaginary parts, respectively, over desired regions are found. (3) The integral intensity is found by calculating $\pm\sqrt{(a^2+b^2)}$. Therefore, based on a theoretical relationship between the real and imaginary parts of the magnetic resonance spectrum, every peak is quantified without phase correcting the peaks.

Other objects and features of the present invention will appear in the course of the description thereof, which follows.

DESCRIPTION OF THE PREFERRED EMBODIMENTS

Figure 1:
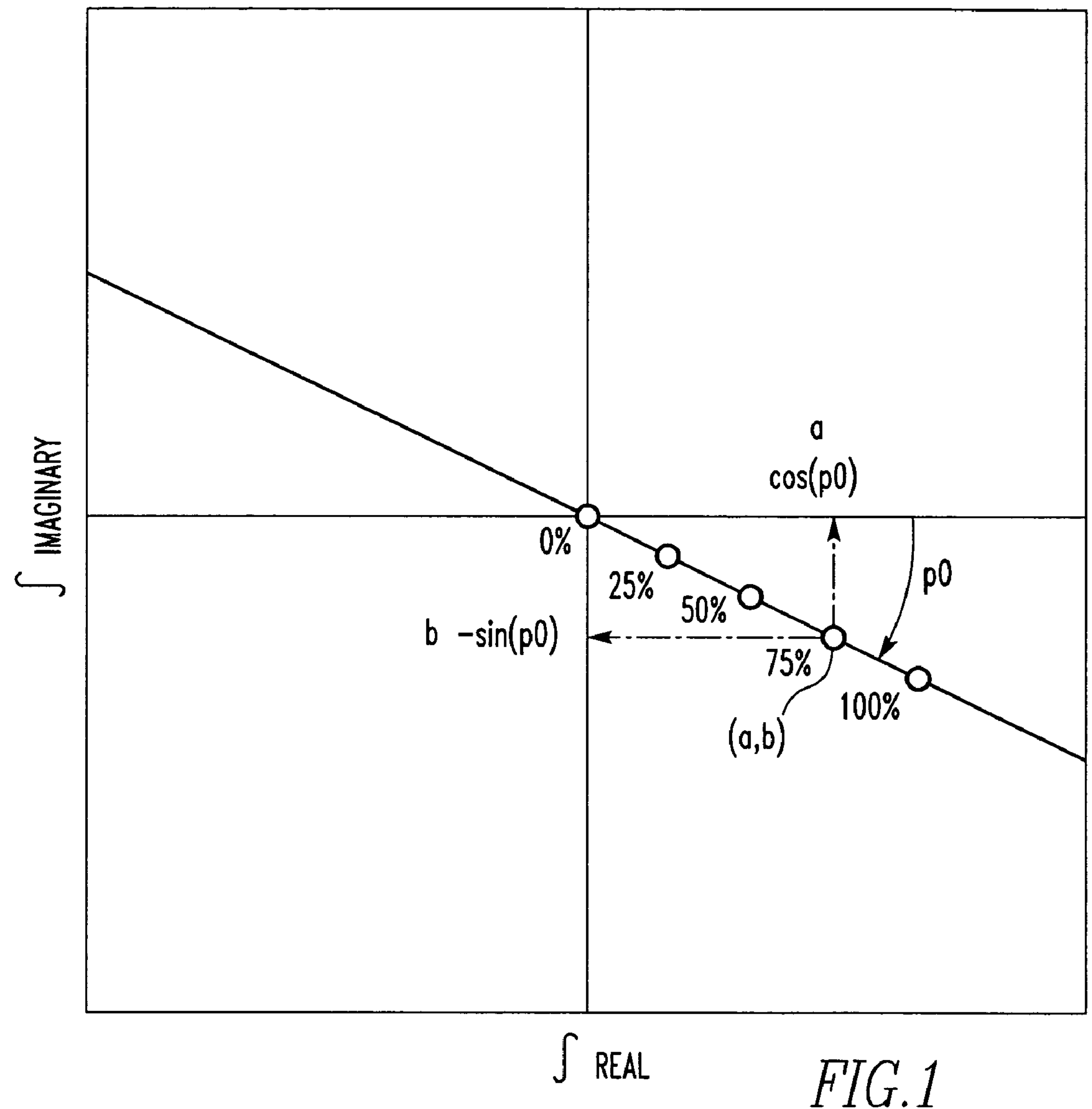
FIG. 1 is a diagram obtained by plotting integrated values of the real and imaginary parts of an NMR spectrum onto a complex plane, the values being obtained by quadrature detection.

In spectroscopy, an amount proportional to energy is often plotted on the horizontal axis, while the intensity of corresponding absorption or resonance is plotted on the vertical axis. In this way, a spectrum is obtained. In methods of Fourier-transform magnetic resonance spectroscopy, such as FT-NMR and FT-ESR, the intensity of resonance at a certain frequency is obtained as a spectrum. It is known that the resonance frequency on the horizontal axis is an amount proportional to the resonance energy. Accordingly, the distribution of resonance energies directly represents a distribution of resonance frequencies. Therefore, the distribution of their real parts is generally represented by an even function.

A Lorentzian distribution (Cauchy distribution) function is taken as an example of an even function. The shape f(x) of the real part of a resonance peak is given by $$f(x) = \frac{1}{\pi} \cdot \frac{1/T_2}{(1/T_2)^2 + (x - x_0)^2} \tag{1}$$

where π is the ratio of the circumference of a circle to its diameter, $T_2$ is a constant regarding a relaxation time, and $x_0$ is the center frequency of the resonance peak. At this time, a Hilbert transform relationship exists between the spectrum (f(x)) of the real part and the spectrum (g(x)) of the imaginary part which are 90° out of phase. Therefore, the shape g(x) of the imaginary part of the resonance peak is given by $$\begin{aligned} g(x) &= f(x)^* \frac{1}{\pi x} \\ &= \frac{1}{\pi} \int_{-\infty}^{\infty} \frac{f(x)}{x - t} dt \\ &= \frac{1}{\pi} \cdot \frac{(x - x_0)}{(1/T_2)^2 + (x - x_0)^2} \end{aligned} \tag{2}$$

Accordingly, an integral-differential relationship exists between the spectrum of the imaginary part and the spectrum of the real part. When the spectrum of the real part is an even function, the spectrum of the imaginary part is an odd function. Since the shape of the peak of the spectrum does not show a Lorentzian distribution, the peak obtained generally can be expressed as a superimposition of even functions. Therefore, the relationship that the real and imaginary parts are, respectively, even and odd functions holds for every spectrum. Furthermore, integrated values of the spectra are given by $$\int_{-\infty}^{\infty} f(x)\,dx = 1 \tag{3}$$

$$\int_{-\infty}^{\infty} g(x)\,dx = 0 \tag{4}$$

That is, where the phase of the observed spectrum is appropriately corrected, the integrated value of the spectrum of the imaginary part is zero. Also, the integrated value of the spectrum of the imaginary part has a value proportional to the peak intensity, because no normalization is made in practice.

We now discuss a case where the phases of spectra f'(x) and g'(x) which are 90° out of phase are actually observed by quadrature detection and shifted by $P_0$. Thus, $$\begin{pmatrix} f'(x) \\ g'(x) \end{pmatrix} = \begin{pmatrix} \cos(P_0) & \sin(P_0) \\ -\sin(P_0) & \cos(P_0) \end{pmatrix} \cdot \begin{pmatrix} f(x) \\ g(x) \end{pmatrix} = \begin{pmatrix} f(x)\cos(P_0) + g(x)\sin(P_0) \\ -f(x)\sin(P_0) + g(x)\cos(P_0) \end{pmatrix} \tag{5}$$

At this time, the integrated values of the spectra f'(x) and g'(x) which are 90° out of phase and actually observed by quadrature detection are given by $$\int_{-\infty}^{\infty} f'(x)\,dx = \cos(P_0)\cdot\int_{-\infty}^{\infty} f(x)\,dx + \sin(P_0)\cdot\int_{-\infty}^{\infty} g(x)\,dx = \cos(P_0)\cdot\int_{-\infty}^{\infty} f(x)\,dx \quad (6)$$

$$\int_{-\infty}^{\infty} g'(x)\,dx = -\sin(P_0)\cdot\int_{-\infty}^{\infty} f(x)\,dx + \cos(P_0)\cdot\int_{-\infty}^{\infty} g(x)\,dx = -\sin(P_0)\cdot\int_{-\infty}^{\infty} f(x)\,dx \quad (7)$$

At this time, the integral terms of the above formulas are amounts proportional to the magnetizations of the samples being observed. Therefore, if the magnetizations of the samples being observed are identical in species, the magnitude of each magnetization can be quantified by plotting the integrated values of the real and imaginary parts of magnetizations of the same species having different strengths onto a complex plane. The plotted points are arrayed on the same straight line on the complex plane. Since the gradient of the straight line indicates the sine and cosine components of the phase $P_0$, the value of the zeroth-order phase correction can be determined at the same time.

That is, as shown in FIG. 1, when the integrated value a of the real part and the integrated value b of the imaginary part are plotted on the horizontal and vertical axes, respectively, the distance $\pm\sqrt{(a^2+b^2)}$ of a point given by coordinates (a, b) from the origin is an amount proportional to the strength of the magnetization of the peak of interest. This value is the same as the value assumed when a manual phase correction is made and the integrated value of the real part is taken. That is, points representing 0%, 25%, 50%, 75%, and 100% of the straight line drawn across the complex plane of FIG. 1 represent the sizes of 0%, 25%, 50%, 75%, and 100%, respectively, of the magnetization being observed. The angle $P_0$ represents the deviation of the phase of the magnetization.

In this method of analysis, the required manual operation is only an operation for specifying an area containing a peak to be quantified. All the other operations are performed automatically. Consequently, this is quite effective for automated analysis of experimental results involving modulation of the peak intensity, such as pulse width modulation experiment in Fourier-transform magnetic resonance or titration experiment.

In actual spectral observations, it is sometimes difficult to observe spectra free from instrumental offset. In such cases, it is necessary to analyze the data after obtaining a spectrum measured under conditions where no signal is detected as shown in FIG. 1 (i.e., a spectrum obtained when the peak intensity is 0%). Three specific examples are given below.

EXAMPLE 1

In this example, the contents of known components are first quantified by routine measurements. That is, the same substance is quantified while exchanging the sample tube. Alternatively, the same substance is quantified while causing an eluate from a liquid chromatograph to flow. In this case, the observed sample is a known substance and so the pulse width of the NMR instrument is fixed during measurement. Only the absolute values of peaks are observed. Every spectral peak appears on the positive side. Table I illustrates an algorithm used when the present invention is applied to this case. Measurement steps are given below.

TABLE I

| | |
|---|---|
| START | |
| Step 11 | Plural samples having different concentrations including zero concentration are prepared. None-dimensional (1D) NMR spectra, each consisting of real and imaginary parts, are observed and collected from each sample by quadrature detection (S-11). |
| Step 12 | Integrated values of the real and imaginary parts over given ranges of frequencies of each of the obtained n 1D NMR spectra are found (S-12). |
| Step 13 | The integrated value $x_i$ of the real part and the integrated value $y_i$ of the imaginary part (i = 1, 2, . . . , n) obtained in step (2) are fitted to a straight line y = a x + b (where b is an offset value) on a complex plane by a linear regression technique (S-13). |
| Step 14 | Data points ($x_i$, $y_i$) obtained by an actual measurement are projected onto the fitting line y = a x + b. The projected points are taken as new points ($x_i$, $y_i$) (S-14). |
| Step 15 | The distance ($\sqrt{(x_i - x_0)^2 + (y_i - y_0)^2}$) from a projected data point ($x_0$, $y_0$) under conditions where the concentration is zero to each projected data point ($x_i$, $y_i$) is found. This value is taken as the integral intensity of the NMR peak (magnetization) (S-15). |
| END | |

(1) Plural samples having different concentrations including zero concentration are prepared. N one-dimensional (1D) NMR spectra, each consisting of real and imaginary parts, are observed and collected from each sample by quadrature detection (S-11).

(2) Integrated values of the real and imaginary parts over given ranges of frequencies of each of the obtained n 1D NMR spectra are found (S-12).

(3) The integrated value $x_i$ of the real part and the integrated value $y_i$ of the imaginary part (i=1, 2, . . . , n) obtained in step (2) are fitted to a straight line y=a x+b (where b is an offset value) on a complex plane by a linear regression technique (S-13).

(4) Data points ($x_i$, $y_i$) obtained by an actual measurement are projected onto the fitting line y=a x+b. The projected points are taken as new points ($x_i$, $y_i$) (S-14).

(5) The distance ($\sqrt{(x_i-x_0)^2+(y_i-y_0)^2}$) from a projected data point ($x_0$, $y_0$) under conditions where the concentration is zero to each projected data point ($x_i$, $y_i$) is found. This value is taken as the integral intensity of the NMR peak (magnetization) (S-15).

EXAMPLE 2

In this case, the same sample is measured with varying NMR measurement conditions. That is, variations in the observed peak intensity are observed while varying the pulse width. In this case, what is varied is the pulsed width and so it is possible that a peak value appears either on the positive side or on the negative side. Accordingly, in this case, it is necessary to determine both the absolute value of the peak and the sign of the peak value. Table II illustrates an algorithm used when the invention is applied to this case.

Measurement steps are given below.

TABLE II

| | |
|---|---|
| START | |
| Step 21 | N one-dimensional (1D) NMR spectra, each consisting of real and imaginary parts, are observed and collected from a sample by quadrature detection while varying the pulse width (S-21). |
| Step 22 | The integrated values of the real and imaginary parts, respectively, over given ranges of frequencies of each of the obtained n 1D NMR spectra are found (S-22). |
| Step 23 | The integrated value $x_i$ of the real part and integrated value $y_i$ of the imaginary part (i = 1, 2, . . . , n) obtained in step (2) are fitted to a straight line y − a x + b (where b is an offset value) on a complex plane by a linear regression technique (S-23). |
| Step 24 | Actually measured data points ($x_i$, $y_i$) are projected onto the fitting line y = a x + b. The projected points are taken as new points ($x_i$, $y_i$) (S-24). |
| Step 25 | The value of the distance ($\sqrt{(x_i - x_0)^2 + (y_i - y_0)^2}$) from a projected data point ($x_0$, $y_0$) under conditions where a pulse having such a width that no NMR signal is detected is applied to the sample (e.g., when the pulse width is set to zero or alternate positive and negative pulses having the same width are applied) to each projected data point ($x_i$, $y_i$) is found. This value is taken as the absolute value of the integral intensity of the NMR peak (magnetization) (S-25). |
| Step 26 | Reference data items are taken as the coordinate values ($x_1$, $y_1$) of the first point. The sign ($sign_i$) of ($x_i$, $x_0$)/($x_1 - x_0$) is found for the ith data item ($x_i$, $y_i$). This sign is taken as the sign of the NMR peak (magnetization)(S-26). |
| Step 27 | Based on the absolute value obtained in step (5) and the sign obtained in step (6), the value of $sign_i \times \sqrt{(x_i - x_0)^2 + (y_i - y_0)^2}$ is found. This value is taken as the integral intensity of the NMR peak (magnetization) (S-27). |
| END | |

(1) N one-dimensional (1D) NMR spectra, each consisting of real and imaginary parts, are observed and collected from a sample by quadrature detection while varying the pulse width (S-21).

(2) The integrated values of the real and imaginary parts, respectively, over given ranges of frequencies of each of the obtained n 1D NMR spectra are found (S-22).

(3) The integrated value $x_i$ of the real part and integrated value $y_i$ of the imaginary part (i=1, 2, . . . , n) obtained in step (2) are fitted to a straight line y=a x+b (where b is an offset value) on a complex plane by a linear regression technique (S-23).

(4) Actually measured data points ($x_i$, $y_i$) are projected onto the fitting line y=a x+b. The projected points are taken as new points ($x_i$, $y_i$) (S-24).

(5) The value of the distance ($\sqrt{(x_i-x_0)^2+(y_i-y_0)^2}$) from a projected data point ($x_0$, $y_0$) under conditions where a pulse having such a width that no NMR signal is detected is applied to the sample (e.g., when the pulse width is set to zero or alternate positive and negative pulses having the same width are applied) to each projected data point ($x_i$, $y_i$) is found. This value is taken as the absolute value of the integral intensity of the NMR peak (magnetization) (S-25).

(6) Reference data items are taken as the coordinate values ($x_1$, $y_1$) of the first point. The sign ($sign_i$) of ($x_i-x_0$)/($x_1-x_0$) is found for the ith data item ($x_i$, $y_i$). This sign is the sign of the NMR peak (magnetization) (S-26).

(7) Based on the absolute value obtained in step (5) and the sign obtained in step (6), the value of $sign_i \times \sqrt{(x_i-x_0)^2+(y_i-y_0)^2}$ is found. This value is taken as the integral intensity of the NMR peak (magnetization) (S-27).

The difference between the algorithm illustrated in Table I and the algorithm illustrated in Table II is only whether information indicating the sign (positive or negative) of the distance is added or not after the distance from the projected data point ($x_0$, $y_0$) to each projected data point ($x_i$, $y_i$) is found. Accordingly, the algorithm of Table I and the algorithm of Table II can also be expressed by one algorithm as illustrated in Table III by adding a decision step performed as to whether all peaks are positive.

TABLE III

| | |
|---|---|
| START | |
| | Plural samples having different concentrations including zero concentration are prepared. None-dimensional (1D) NMR spectra, each consisting of real and imaginary parts, are observed and collected from each sample by quadrature detection. |
| | Integrated values of the real and imaginary parts over given ranges of frequencies of each of the obtained n 1D NMR spectra are found. |
| | The integrated value $x_i$ of the real part and the integrated value $y_i$ of the imaginary part (i = 1, 2, . . . , n) obtained in step (2) are fitted to a straight line y = a x + b (where b is an offset value) on a complex plane by a linear regression technique. |
| | Data points ($x_i$, $y_i$) obtained by an actual measurement are projected onto the fitting line y = a x + b. The projected points are taken as new points ($x_i$, $y_i$). |
| | The distance ($\sqrt{(x_i - x_0)^2 + (y_i - y_0)^2}$) from a projected data point ($x_0$, $y_0$) under conditions where the concentration is zero to each projected data point ($x_i$, $y_i$) is found. This value is taken as the integral intensity of the NMR peak (magnetization). |
| YES | Are all peaks positive? |
| END | |
| NO | Reference data items are taken as the coordinate values ($x_i$, $y_i$) of the first point. The sign ($sign_i$) of ($x_i$, $x_0$)/($x_1 - x_0$) is found for the ith data item ($x_i$, $y_i$). This sign is taken as the sign of the NMR peak (magnetization). |
| | Based on the absolute value obtained in step (5) and the sign obtained in step (6), the value of $sign_i \times \sqrt{(x_i - x_0)^2 + (y_i - y_0)^2}$ is found. This value is taken as the integral intensity of the NMR peak (magnetization) |
| END | |

EXAMPLE 3

Where a program (e.g., a program described in the above-cited Japanese Patent Laid-Open No. 2004-325407) capable of analytically determining integrated values ($x_0$, $y_0$) of the real and imaginary parts of a point at which the peak intensity is zero by doing curve fitting (i.e., having a capability of correcting the offset) is used, the algorithm illustrated in Table IV is applied.

TABLE IV

| | |
|---|---|
| START | |
| Step 31 | N one-dimensional (1D) NMR spectra, each consisting of real and imaginary parts, are observed and collected from a sample by quadrature detection while varying the pulse width (S-31). |
| Step 32 | Integrated values of the real and imaginary parts, respectively, over given ranges of frequencies of each of the obtained n 1D NMR spectra are found (S-32). |
| Step 33 | The integrated value $x_i$ of the real part and the integrated value $y_i$ of the imaginary part (i = 1, 2, . . . , n) obtained in step (2) are fitted to a straight line y = a x + b (where b is an offset value) on a complex plane by a linear regression technique (S-33). |
| Step 34 | Actually measured data points ($x_i$, $y_i$) are projected onto the fitting line y = a x + b. The projected points are taken as new points ($x_i$, $y_i$) (S-34). |
| Step 35 | Reference data items are taken as the coordinate values ($x_1$, $y_1$) of the first point. The sign ($sign_i$) of ($x_i - x_1$) is found for the ith data item ($x_i$, $y_i$). This sign is taken as the sign of the NMR peak (magnetization) (S-35). |
| Step 36 | Based on the sign ($sign_i$) obtained in step (5), the value of $sign_i \times \sqrt{(x_i - x_1)^2 + (y_i - y_1)^2}$ is found. The value is handed over to a least squares fitting program for calculating a pulse width, the program being described in the above-cited Patent Reference 4 for automatically determining an optimum pulse width (S-36). |
| Step 37 | Based on the technique described in the above-cited Patent Reference 4, the dependence of the magnitude of the magnetization on the pulse width is curve-fitted to a given model function. The offset value ($x_0$, $y_0$) of the magnetization is found from parameters of the model function to which the curve-fitting has been done. A pulse width (e.g., 90° pulse width) optimal for observation of a spectrum is automatically determined (S-37). |
| END | |

It is not necessary to gain the integrated value $x_0$ of the real part and the integrated value $y_0$ of the imaginary part at the point at which the peak intensity is zero, by an actual measurement. When this technique is applied to a nutation experiment in calibrating the pulse width in practice, the following steps are carried out.

(1) N one-dimensional (1D) NMR spectra, each consisting of real and imaginary parts, are observed and collected from a sample by quadrature detection while varying the pulse width (S-31).

(2) Integrated values of the real and imaginary parts, respectively, over given ranges of frequencies of each of the obtained n 1D NMR spectra are found (S-32).

(3) The integrated value $x_i$ of the real part and the integrated value $y_i$ of the imaginary part (i=1, 2, . . . , n) obtained in step (2) are fitted to a straight line y=a x+b (where b is an offset value) on a complex plane by a linear regression technique (S-33).

(4) Actually measured data points ($x_i$, $y_i$) are projected onto the fitting line y=a x+b. The projected points are taken as new points ($x_i$, $y_i$) (S-34).

(5) Reference data items are taken as the coordinate values ($x_1$, $y_1$) of the first point. The sign ($sign_i$) of ($x_i-x_1$) is found for the ith data item ($x_i$, $y_i$). This sign is taken as the sign of the NMR peak (magnetization) (S-35).

(6) Based on the sign ($sign_i$) obtained in step (5), the value of $sign_i \times \sqrt{(x_i-x_1)^2+(y_i-y_1)^2}$ is found. The value is handed over to a least squares fitting program for calculating a pulse width, the program being described in the above-cited Patent Reference 4 for automatically determining an optimum pulse width (S-36).

(7) Based on the technique described in the above-cited Japanese Patent Laid-Open No. 2004-325407, the dependence of the magnitude of the magnetization on the pulse width is curve-fitted to a given model function. The offset value ($x_0$, $y_0$) of the magnetization is found from parameters of the model function to which the curve-fitting has been done. A pulse width (e.g., 90° pulse width) optimal for observation of a spectrum is automatically determined (S-37).

Figure 2A:
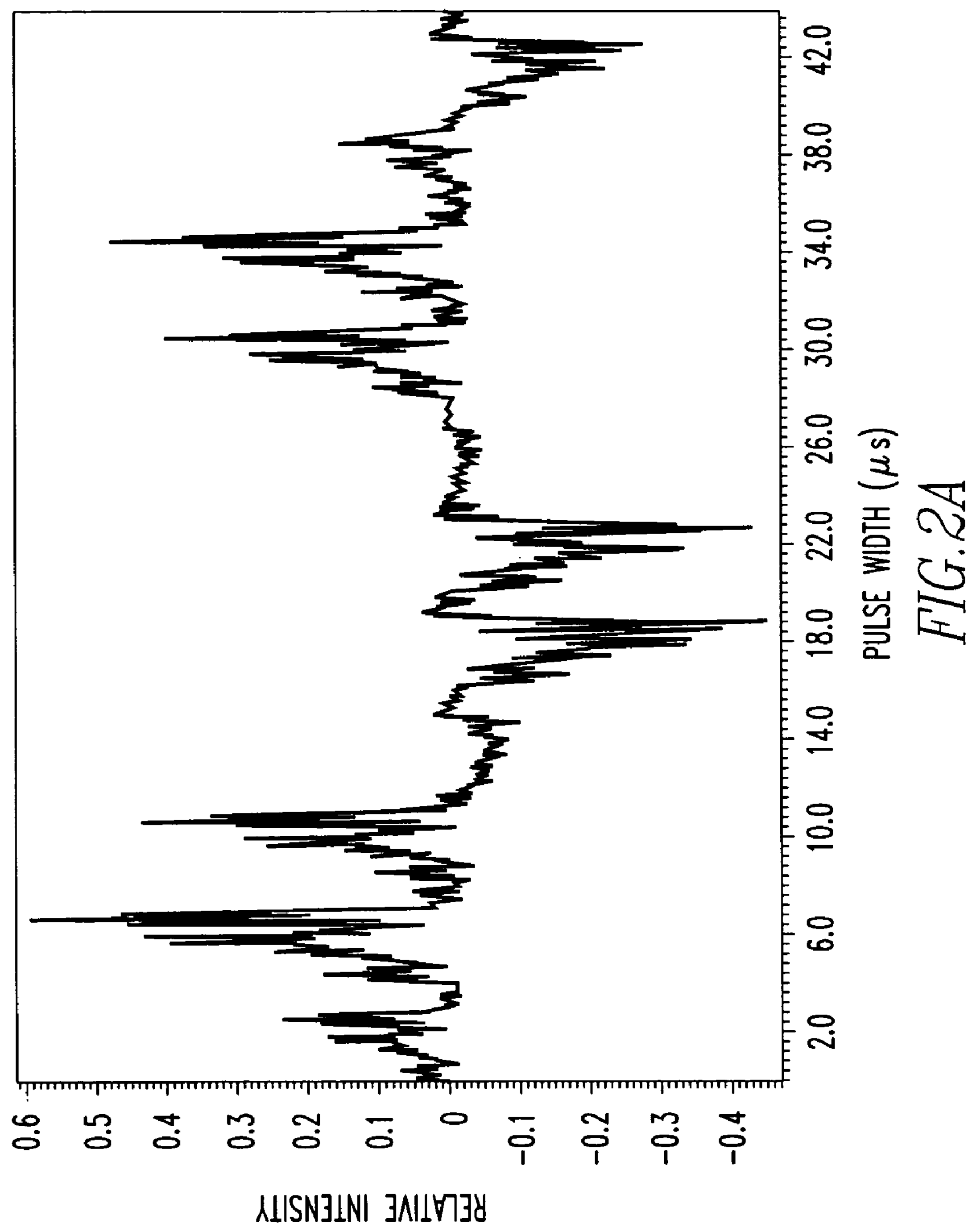
FIGS. 2A and 2B are diagrams showing the real and imaginary parts of NMR spectra.
Figure 2B:
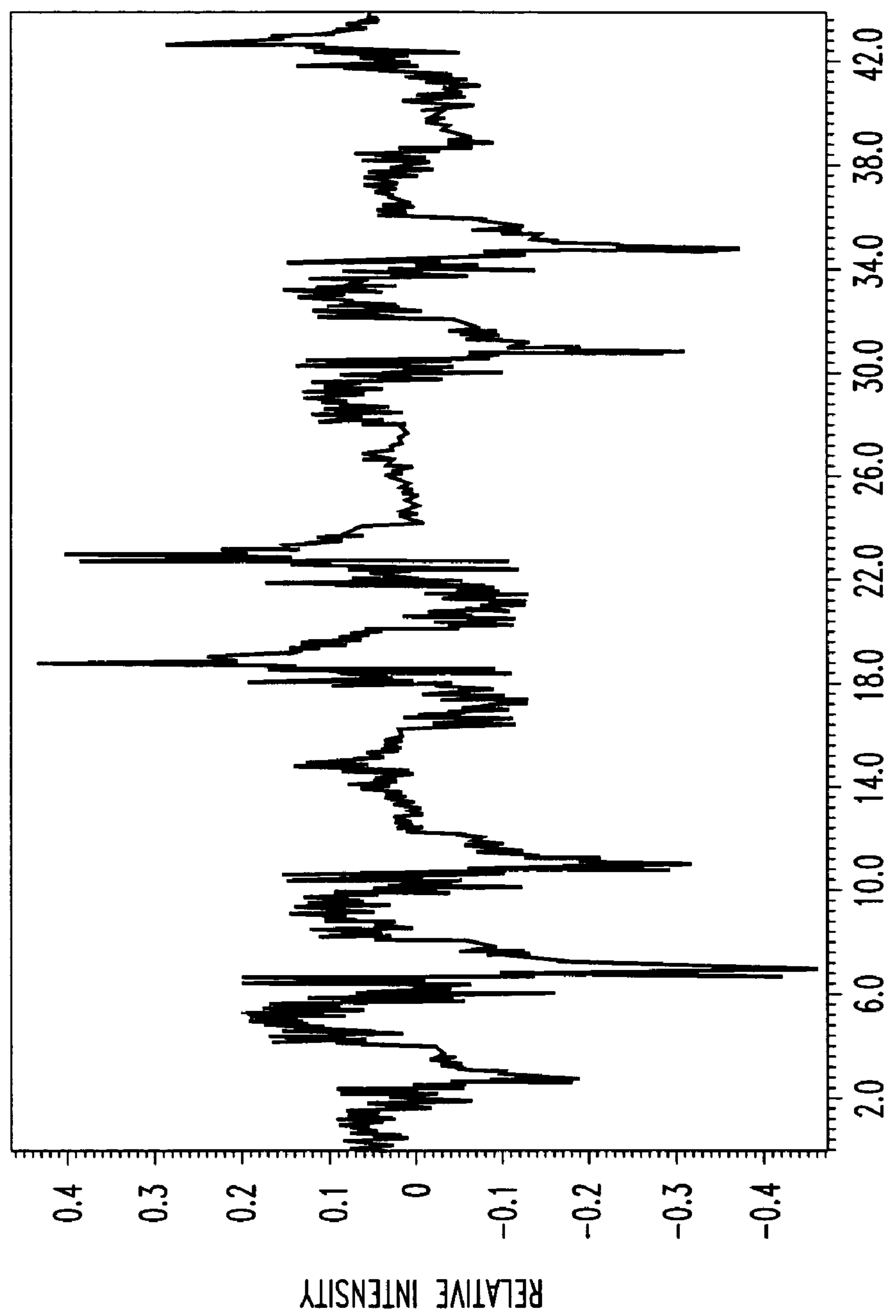
Figure 3A:
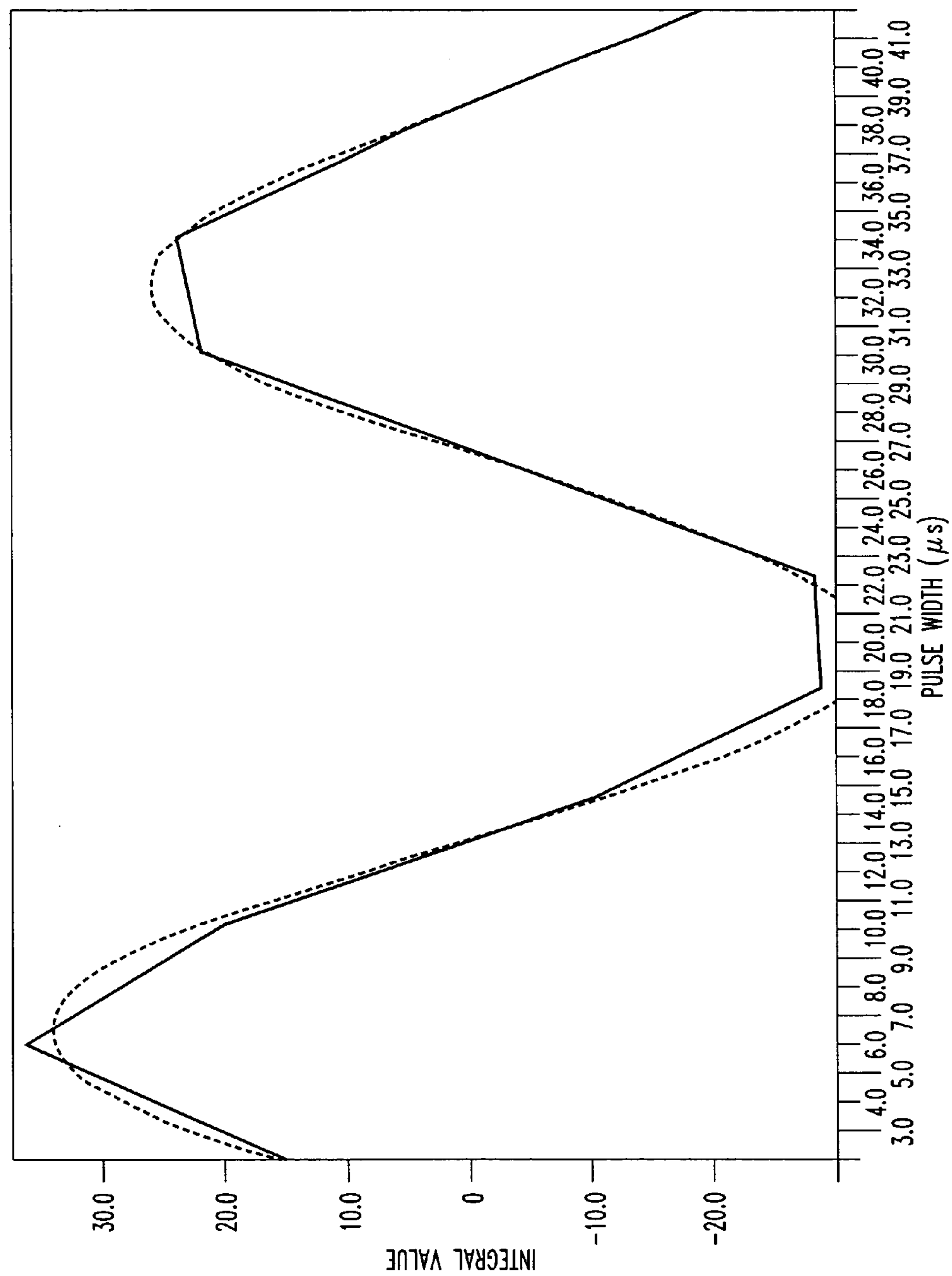
FIGS. 3A and 3B illustrate a method of curve-fitting the real and imaginary parts of the NMR spectra of FIGS. 2A and 2B to a model function by a known technique for automatically determining an optimum pulse width.
Figure 3B:
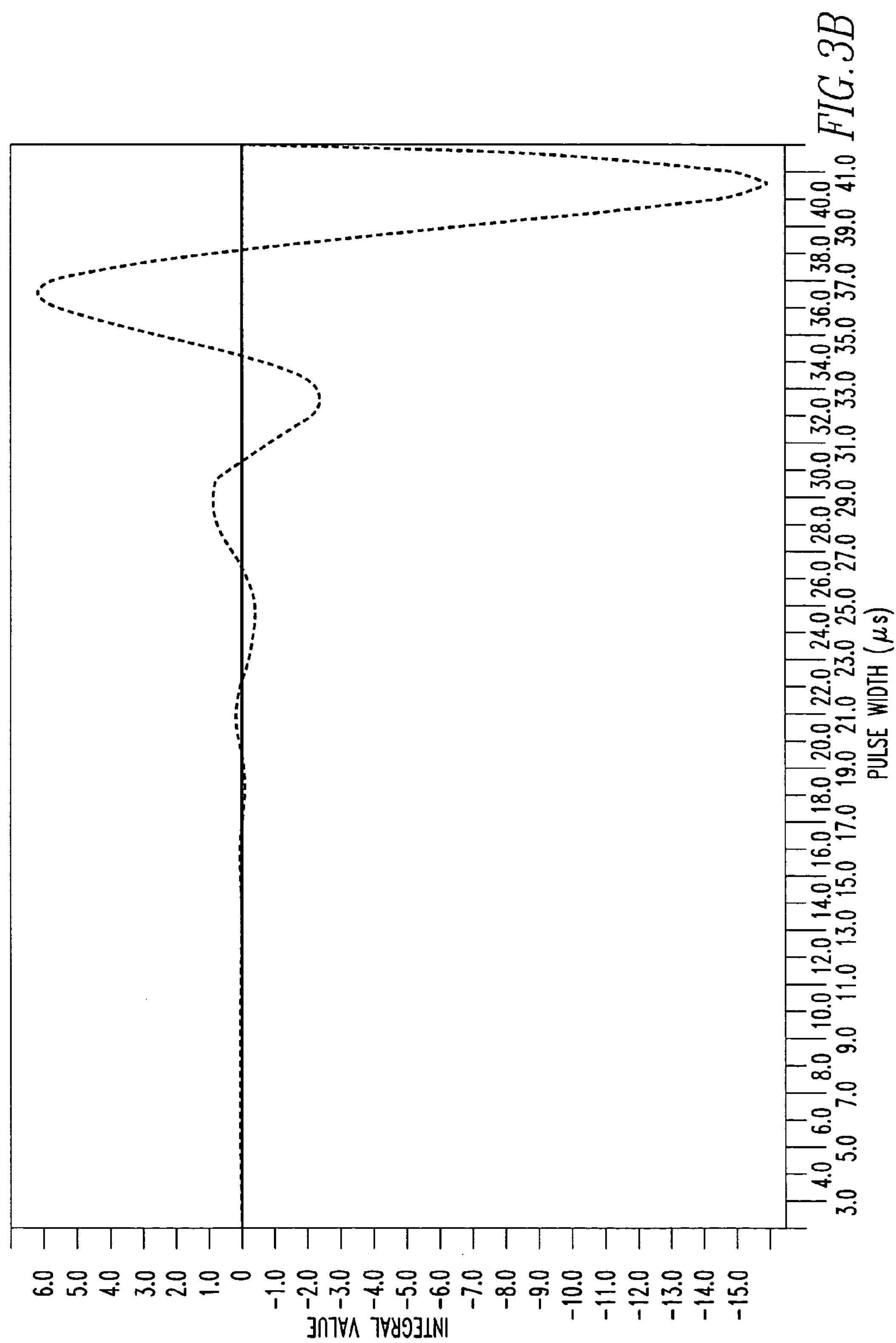

An example in which this technique is actually applied to data about a nutation experiment for pulse width calibration in practice is described below. FIGS. 2A and 2B are diagrams in which 11 spectra produced by a single pulse sequence are arrayed. FIG. 2A shows a spectrum of the real part, and FIG. 2B shows a spectrum of the imaginary part. To determine a pulse width optimal for the data shown in FIGS. 2A and 2B by the automatic determination technique described in the above-cited Japanese Patent Laid-Open No. 2004-325407, it is necessary that the integrated value of the spectrum of the real part be plotted against the excitation pulse width during observation and that the value be curve-fitted to a given model function by a least squares method. The pulse width optimal for the observation of the spectrum can be automatically determined from parameters of the model function when the fitting is done.

Where the pulse width optimal for the data is determined in this way by the automated determination technique described in the above-cited Japanese Patent Laid-Open No. 2004-325407, the 90° pulse width can be determined to be 6.51235 μs as shown in FIG. 3A.

However, the phase of a magnetic resonance spectrum obtained experimentally in practice differs according to measurement conditions. Therefore, in a case of automated processing in which no phase correction is made, a spectrum that is 90° out of phase as shown in FIG. 2B may be processed. If the spectrum of FIG. 2B is processed in practice in the same way as the spectrum of FIG. 2A, fitting produces results as shown in FIG. 4B. That is, the fitting to the used model function is far from ideal. It is obvious that undesirable results have taken place.

Figure 4A:
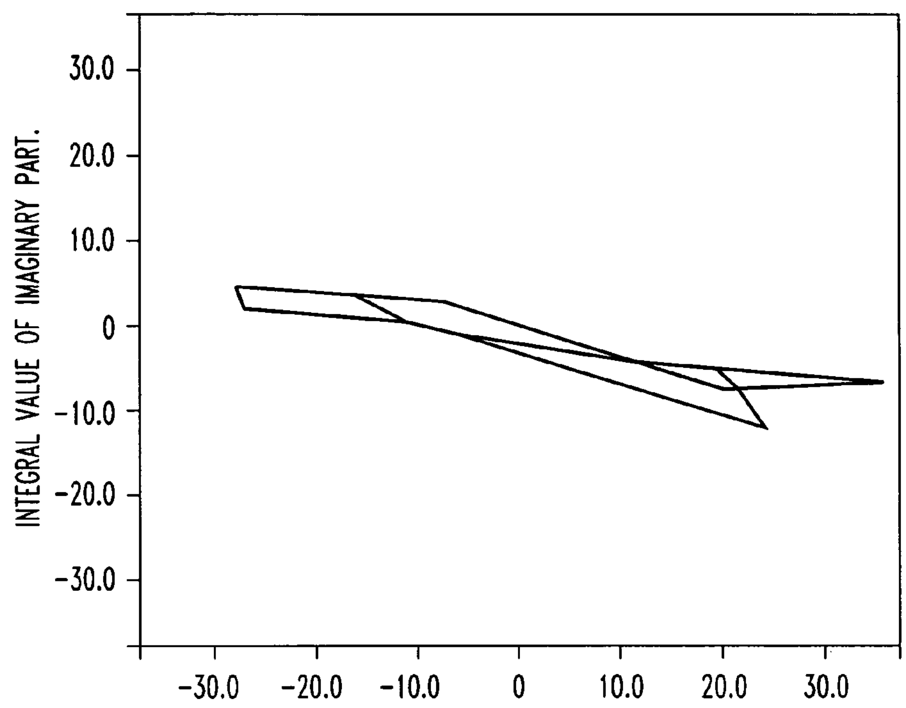
FIGS. 4A, 4B, 4C, 4D, and 4E are diagrams obtained by plotting integrated values of the real and imaginary parts of the NMR spectra of FIGS. 2A and 2B onto a complex plane.
Figure 4B:
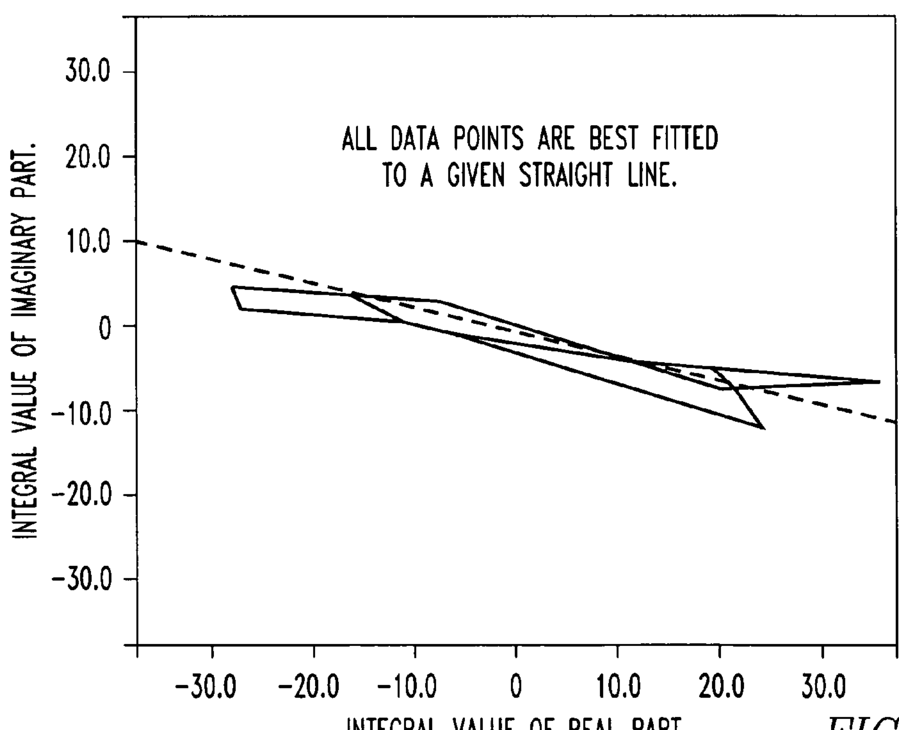
Figure 4C:
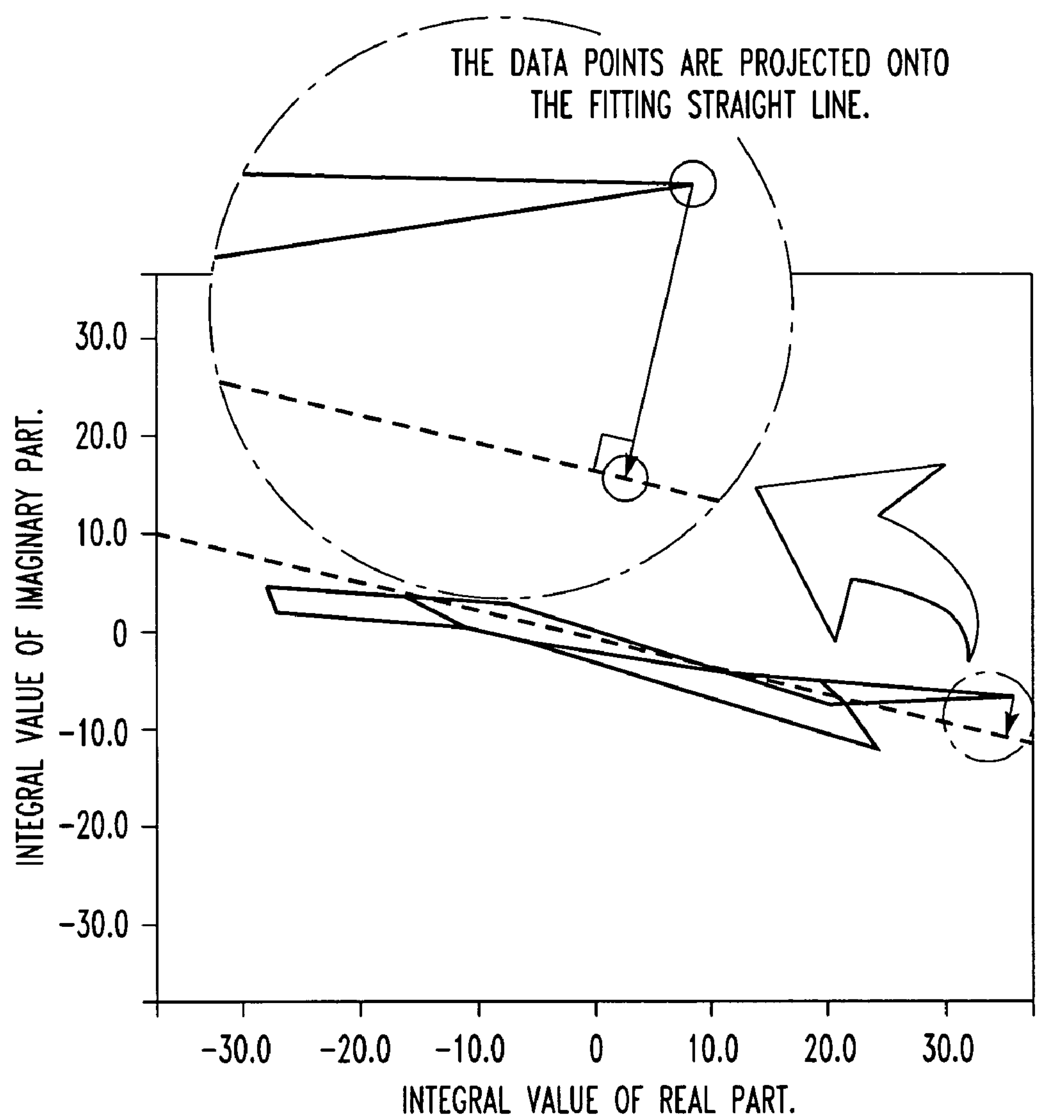
Figure 4D:
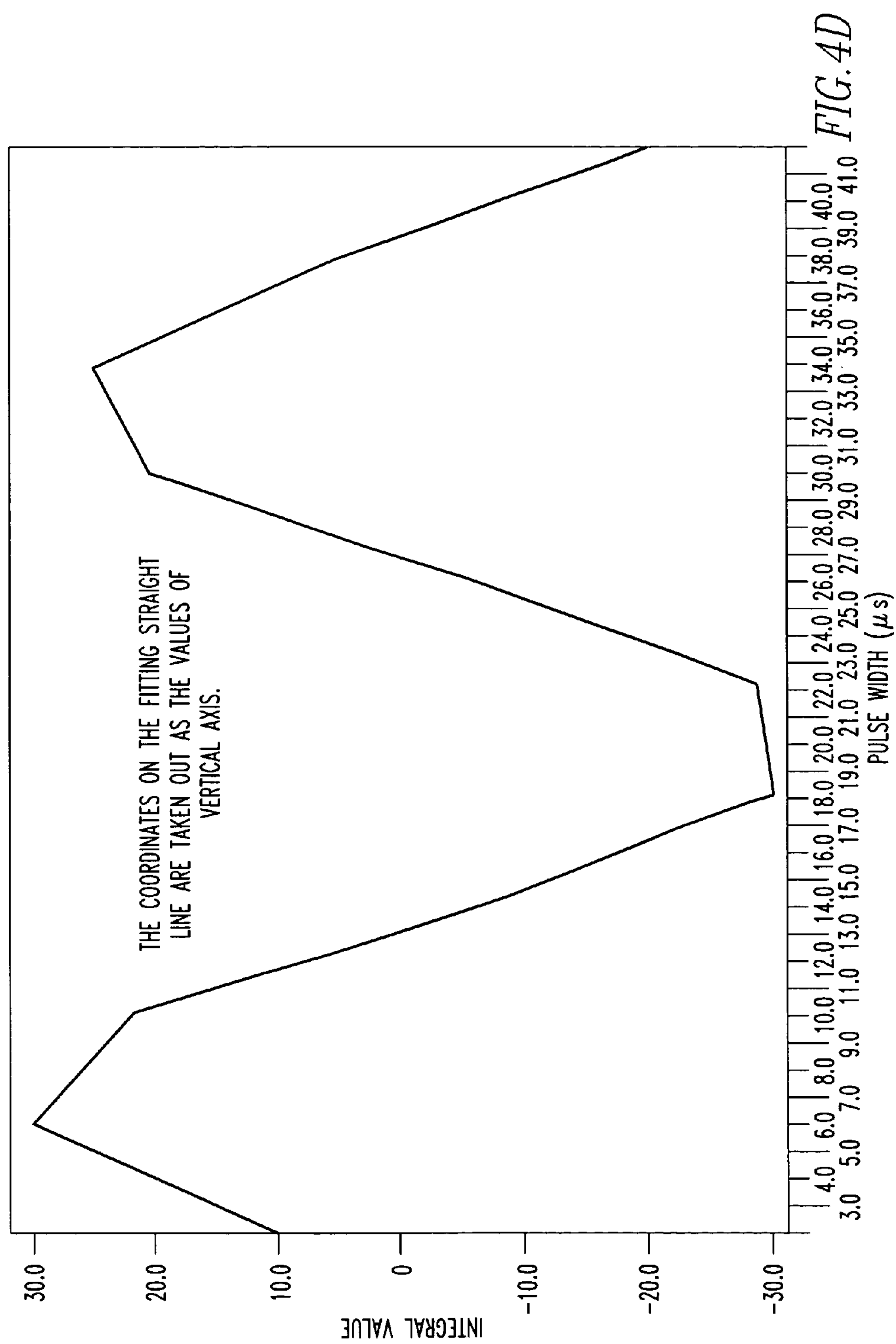
Figure 4E:
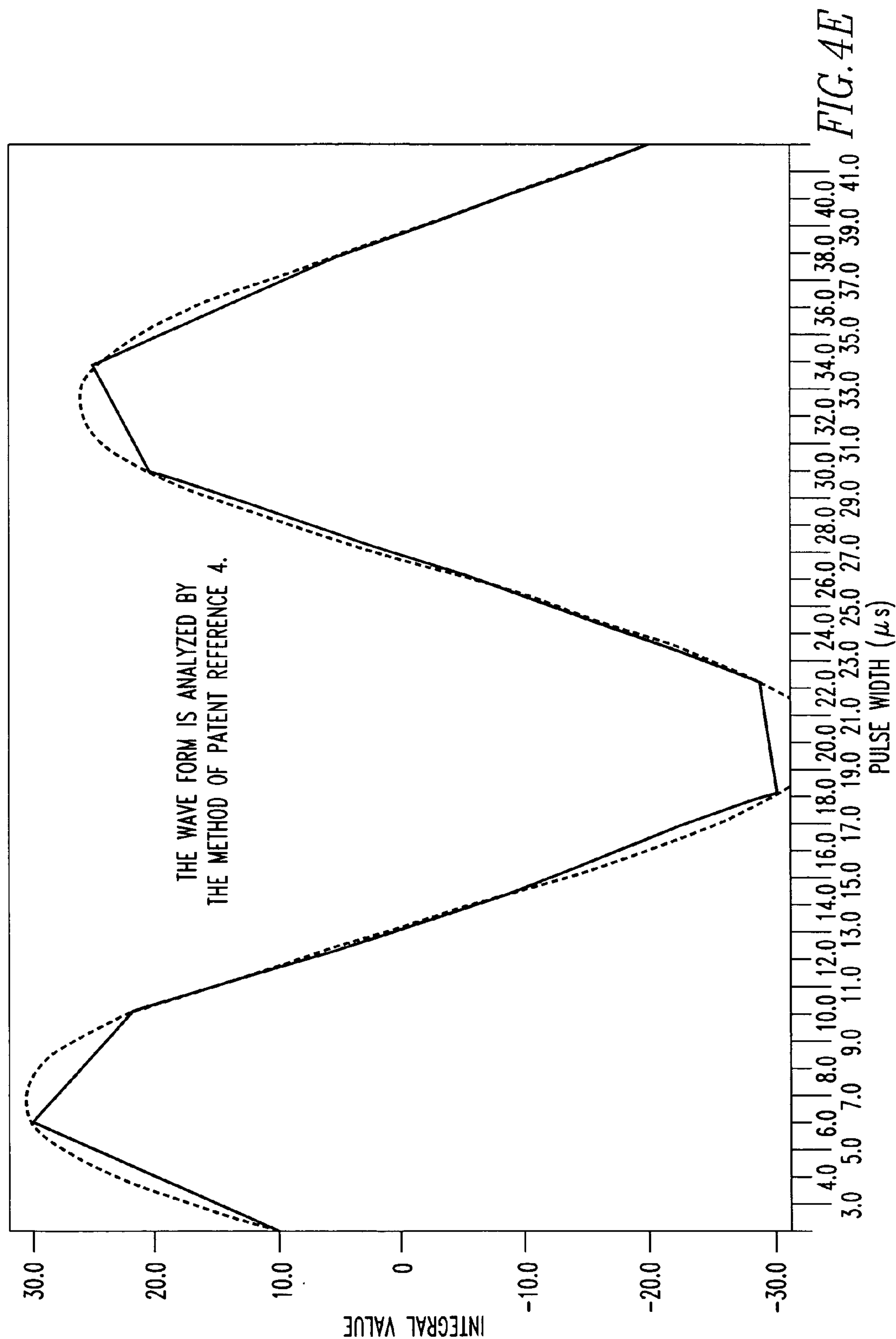

Plotting the integrated values of the real and imaginary parts onto a complex plane has resulted in a diagram as shown in FIG. 4A. It can be seen from this diagram that the points representing the integrated values are aligned substantially on a straight line. Accordingly, with respect to this spectrum, all data points are best-fitted to a given straight line as shown in (b) of FIG. 4B. Furthermore, as shown in FIG. 4C, the data points are projected onto the fitting straight line. That is, the data points are transformed. As a result, values corresponding to the integrated value of the real part when the phase is appropriately corrected can be obtained.

Projecting data points onto a straight line is to transform the coordinates of the data points into the coordinates of the intersections of the fitting straight line and perpendicular lines drawn to the straight line from the data points. For example, if the fitting straight line is a straight line given by $y=a\,x+b$, the ith data point $(x_i, y_i)$ is transformed into the coordinates $((a\,y_i+x_i-a\,b)/(a^2+1), (a^2y_i+x_i+b)/(a^2+1))$ of the intersection of the straight line $y=a\,x+b$ and its perpendicular line $y=-1/a\,(x-x_i)+y_i$.

Figure 5A:
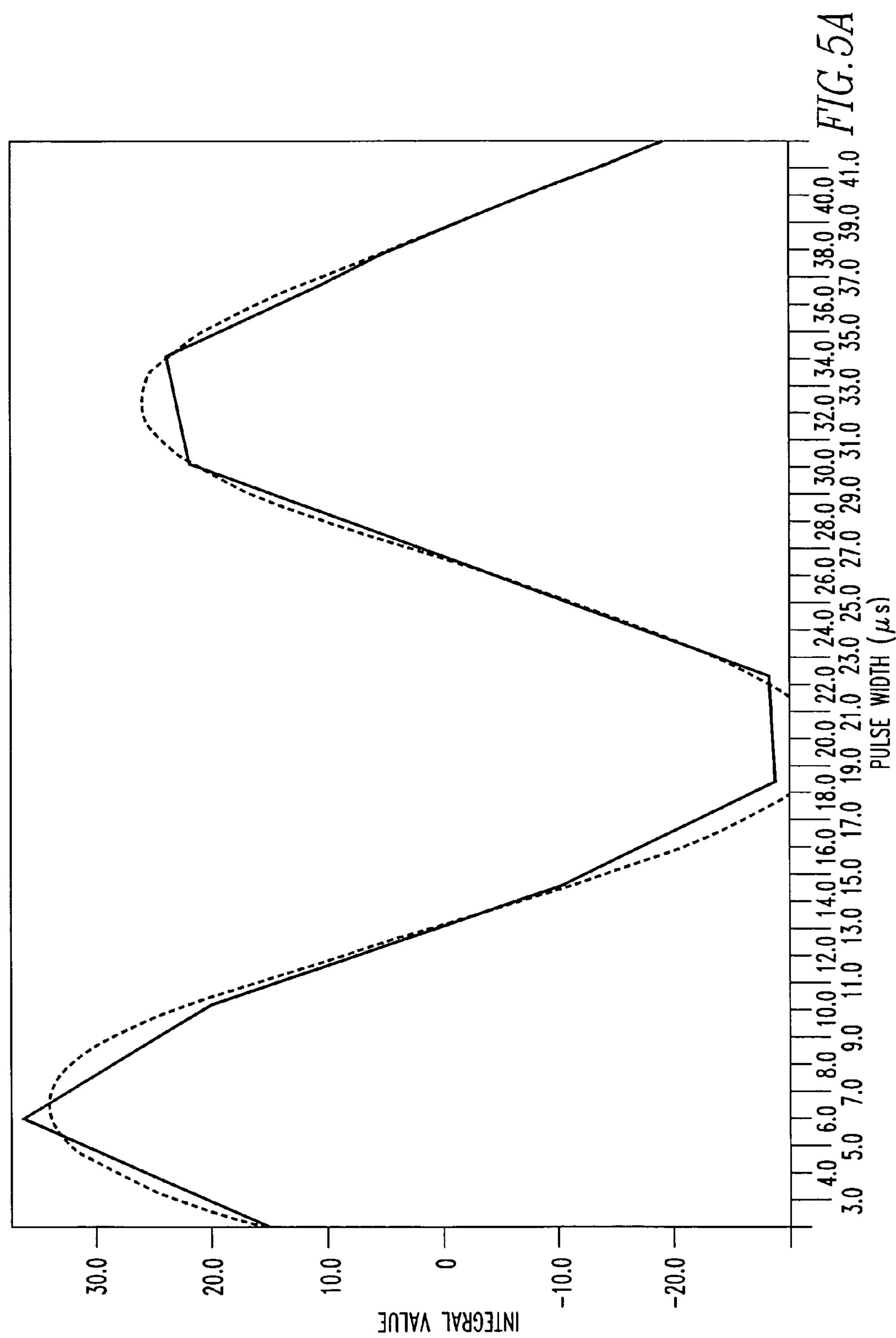
FIGS. 5A and 5B are diagrams obtained by curve-fitting the real and imaginary parts of the NMR spectra of FIGS. 2A and 2B to a model function by a technique according to the present invention.
Figure 5B:
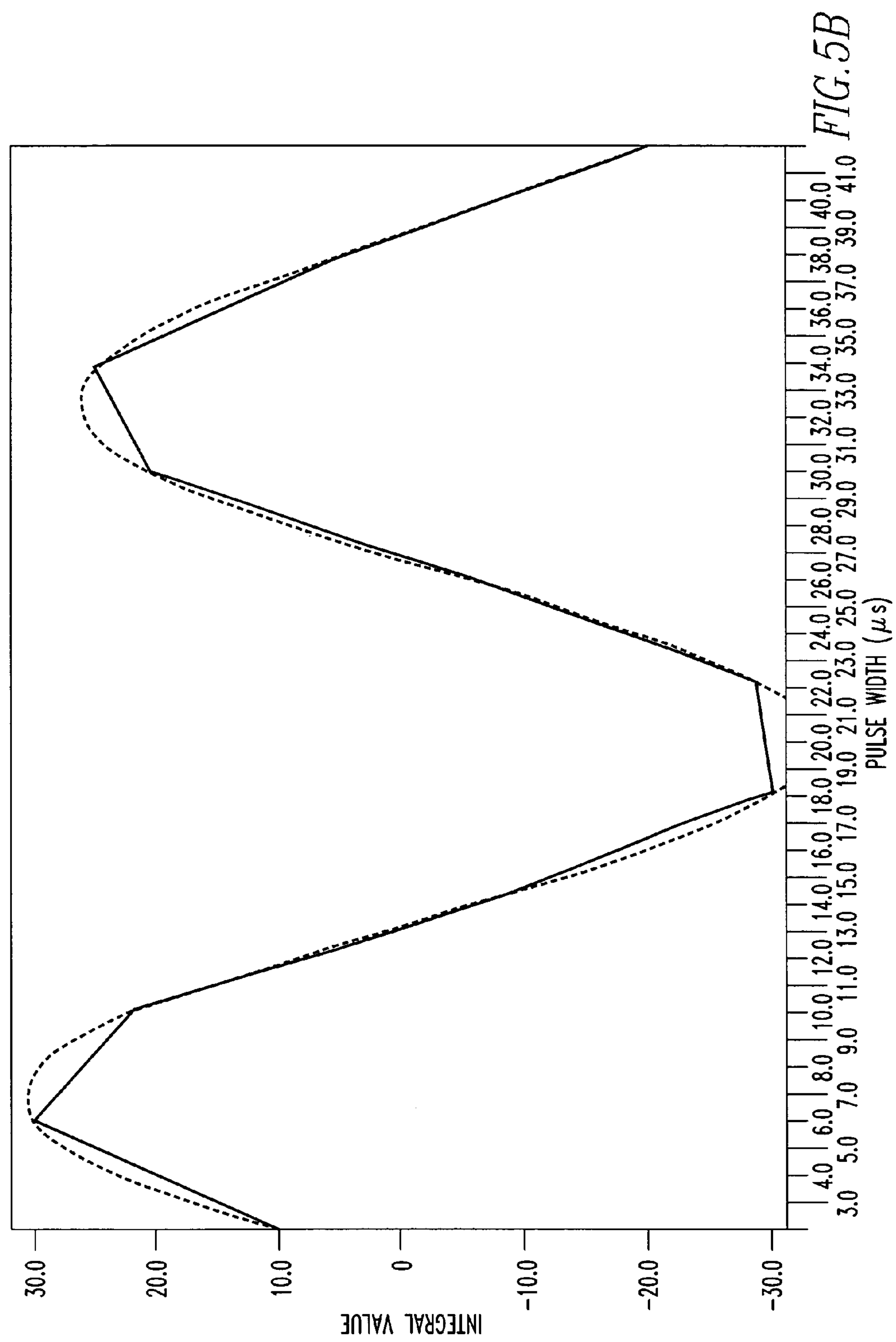

Values obtained in this way were processed by the above-described automated determination technique (Japanese Patent Laid-Open No. 2004-325407) in the same way as in FIGS. 2A and 2B. The optimum 90° pulse width had a value of 6.50734 to 6.57443 μs as shown in FIGS. 5A and 5B. This value is almost coincident with a value previously obtained with manual spectral phase correction. Accordingly, if the intensity of the magnetization quantified by the spectrum-quantifying method according to the present invention is determined by the pulse width-determining method described in the Japanese Patent Laid-Open No. 2004-325407, a pulse width optimal for the observation of the spectrum can be determined precisely even if a real part spectrum involving an extremely large phase shift is used.

It is to be understood that this method can be applied to pulsed ESR measurements as well as to pulsed NMR measurements. The present invention can be widely applied to Fourier-transform magnetic resonance instruments.

Having thus described our invention with the detail and particularity required by the Patent Laws, what is desired protected by Letters Patent is set forth in the following claims.

The invention claimed is:

1. A method of quantifying a magnetic resonance spectrum, comprising the steps of:

(1) observing and collecting n one-dimensional (1D) magnetic resonance spectra, each consisting of real and imaginary parts, by quadrature detection;

(2) finding integrated values, $x_i$ and $y_i$ (where i=1, 2, . . . , n), of the real and imaginary parts, respectively, over given ranges of frequencies of each of the obtained n 1D magnetic resonance spectra;

(3) fitting the integrated values $x_i$ and $y_i$ of the real and imaginary parts obtained in step (2) to a straight line $y=a\,x+b$, where b is an offset value, on a complex plane by a linear regression technique;

(4) projecting actually measured data points $(x_i, y_i)$ onto the fitting straight line $y=a\,x+b$ and taking the projected points as novel data points $(x_i, y_i)$;

(5) taking reference data items as coordinate values $(x_1, y_1)$ of a first point, finding a sign ($\text{sign}_i$) of $(x_i-x_1)$ of an ith data item $(x_i, y_i)$, and taking this sign as the sign of a spectral peak (magnetization);

(6) finding a value of $\text{sign}_i\times\sqrt{(x_i-x_1)^2+(y_i-y_1)^2}$ based on the sign ($\text{sign}_i$) obtained in step (5) and handing the value over to a least squares fitting program for calculating a pulse width; and (7) curve-fitting dependence of the strength of the spectral peak (magnetization) on the pulse width to a given model function based on the least squares fitting program for calculation of a pulse width and determining a pulse width optimal for observation of the spectrum from parameters of the model function to which the curve-fitting has been done.

2. A method of quantifying a magnetic resonance spectrum, comprising the steps of:

(1) observing and collecting n one-dimensional (1D) magnetic resonance spectra, each consisting of real and imaginary parts, by quadrature detection;

(2) finding integrated values, $x_i$ and $y_i$ (where i=1, 2, . . . , n), of real and imaginary parts, respectively, over given ranges of frequencies of each of the obtained n 1D magnetic resonance spectra;

(3) fitting the integrated values $x_i$ and $y_i$ of the real and imaginary parts obtained in step (2) to a straight line $y=a\,x+b$, where b is an offset value, on a complex plane by a linear regression technique;

(4) projecting actually measured data points $(x_i, y_i)$ onto the fitting straight line $y=a\,x+b$ and taking the projected points as novel data points $(x_i, y_i)$;

(5) finding a value of distance $\sqrt{(x_i-x_0)^2+(y_i-y_0)^2}$ from a projected data point $(x_0, y_0)$ under conditions where the peak intensity is zero to each projected data point $(x_i, y_i)$ and taking the value as an absolute value of an integral intensity of a spectral peak (magnetization) in the spectrum;

(6) taking reference data items as coordinate values $(x_1, y_1)$ of a first point, finding a sign ($\text{sign}_i$) of $(x_i-x_0)/(x_1-x_0)$ of an ith data item $(x_i, y_i)$, and taking this sign as the sign of a spectral peak (magnetization); and (7) finding a value of $\text{sign}_i\times\sqrt{(x_i-x_0)^2+(y_i-y_0)^2}$ based on absolute value obtained in step (5) and the sign obtained in step (6) and taking this value as an integral intensity of a spectral peak (magnetization).

3. A method of quantifying a magnetic resonance spectrum according to claim 2, wherein an optimum pulse width is automatically determined during measurement of the magnetic resonance spectrum using the integral intensity of the spectral peak (magnetization).

4. A method of quantifying a magnetic resonance spectrum, comprising the steps of:

(1) observing and collecting n one-dimensional (1D) magnetic resonance spectra, each consisting of real and imaginary parts, by quadrature detection;

(2) finding integrated values, $x_i$ and $y_i$ (where i=1, 2, . . . , n), of real and imaginary parts, respectively, over given ranges of frequencies of each of the obtained n 1D magnetic resonance spectra;

(3) fitting the integrated values $x_i$ and $y_i$ obtained in step (2) to a straight line $y=a\,x+b$, where b is an offset value, on a complex plane by a linear regression technique;

(4) projecting actually measured data points $(x_i, y_i)$ onto the fitting straight line $y=a\,x+b$ and taking the projected points as novel data points $(x_i, y_i)$; and (5) finding distance $\sqrt{(x_i-x_0)^2+(y_i-y_0)^2}$ from a projected data point $(x_0, y_0)$ under conditions where zero peak intensity is produced to each projected data point $(x_i, y_i)$ and taking the values of the distance as an integral intensity of a spectral peak (magnetization) in the spectrum.

5. A method of quantifying a magnetic resonance spectrum, comprising the steps of:

(1) finding spectra of real and imaginary parts of the spectrum by quadrature detection;

(2) finding integrated values, a and b, over given regions of the obtained spectra of the real and imaginary parts, respectively; and (3) calculating $\pm\sqrt{(a^2+b^2)}$ as an integral intensity of a spectral peak in the magnetic resonance spectrum.

6. A method of quantifying a magnetic resonance spectrum according to claim 5, wherein an optimum pulse width is automatically determined during measurement of the magnetic resonance spectrum using the integral intensity of the magnetic resonance peak (magnetization), the integral intensity.

7. A method of quantifying a magnetic resonance spectrum as set forth in any claim 5, wherein said magnetic resonance spectrum is an NMR spectrum.

8. A method of quantifying a magnetic resonance spectrum as set forth in claim 5, wherein said magnetic resonance spectrum is an ESR spectrum.

* * * * *

UNITED STATES PATENT AND TRADEMARK OFFICE

CERTIFICATE OF CORRECTION

PATENT NO. : 7,106,059 B2
APPLICATION NO. : 11/107356
DATED : September 12, 2006
INVENTOR(S) : Takasugi et al.

It is certified that error appears in the above-identified patent and that said Letters Patent is hereby corrected as shown below:

Column 7, Line 34, Table II, "$(x_i, y_0)/(x_1 - x_0)$" should read -- $(x_i - x_0)/(x_1 - x_0)$ --

Column 8, Line 49, Table III, Step NO, "$(x_i, y_0)/(x_1 - x_0)$ should read -- $(x_i - x_0)/(x_1 - x_0)$ --

Signed and Sealed this

Ninth Day of January, 2007

JON W. DUDAS
*Director of the United States Patent and Trademark Office*